US012566196B2

(12) United States Patent (10) Patent No.: US 12,566,196 B2
Belgarric et al. (45) Date of Patent: Mar. 3, 2026

(54) ANALOG PARAMETER MONITOR

(71) Applicant: Hewlett-Packard Development Company, L.P., Spring, TX (US)

(72) Inventors: Pierre Louis Robert Belgarric, Bristol (GB); David Julien Plaquin, Bristol (GB); Christopher Ian Dalton, Bristol (GB)

(73) Assignee: Hewlett-Packard Development Company, L.P., Spring, TX (US)

( * ) Notice: Subject to any disclaimer, the term of this patent is extended or adjusted under 35 U.S.C. 154(b) by 380 days.

(21) Appl. No.: 18/256,410

(22) PCT Filed: Dec. 11, 2020

(86) PCT No.: PCT/US2020/064572
§ 371 (c)(1),
(2) Date: Jun. 7, 2023

(87) PCT Pub. No.: WO2022/125115
PCT Pub. Date: Jun. 16, 2022

(65) Prior Publication Data
US 2024/0036088 A1 Feb. 1, 2024

(51) Int. Cl.
*G01R 21/06* (2006.01)
*G01R 31/00* (2006.01)
*G06F 21/00* (2013.01)
*G06G 7/62* (2006.01)
(52) U.S. Cl.
CPC .................................. *G01R 21/06* (2013.01)
(58) Field of Classification Search
CPC ............... G01R 22/06; G01R 31/3161; G01R 31/2846; G01R 31/3191; G01R 35/005;

G01R 23/02; G01R 21/133; G06F 21/57; G06F 2221/034; G06F 2221/2135; G06F 11/3409; G06F 11/3452; G06F 11/3466; G06F 11/3058; G06F 11/008; G06F 11/0751; G06F 11/3447; G06F 2201/81; G06F 1/206
USPC ........ 324/76.11; 700/299; 702/60, 182, 186, 702/183, 117, 179, 188, 189, 130, 85, 702/185, 64, 57; 713/300, 320, 323, 340
See application file for complete search history.

(56) References Cited

U.S. PATENT DOCUMENTS

| | | | | |
|---|---|---|---|---|
| 7,047,090 | B2 * | 5/2006 | Turicchi, Jr | G05B 13/024 |
| | | | | 702/182 |
| 7,302,698 | B1 * | 11/2007 | Proudler | G06F 21/57 |
| | | | | 726/2 |
| 8,756,441 | B1 | 6/2014 | Mullins et al. | |
| 8,788,111 | B2 * | 7/2014 | Uhlmann | G06F 1/206 |
| | | | | 700/304 |
| 8,812,166 | B2 * | 8/2014 | Wang | G06F 9/5011 |
| | | | | 703/2 |

(Continued)

*Primary Examiner* — Jeffrey P Aiello
(74) *Attorney, Agent, or Firm* — Quarles & Brady LLP

(57) ABSTRACT

An example computing device comprises a memory storing software, and a processor to, identify an expected parameter value range of a plurality of expected parameter value ranges of a hardware component of the computing device, the expected parameter value range corresponding to a set operating mode of the hardware component; compare an analog parameter value of the hardware component to the identified expected parameter value range; and determine whether the analog parameter value is within or outside the expected parameter value range.

20 Claims, 6 Drawing Sheets

(56) References Cited

U.S. PATENT DOCUMENTS

| | | | | |
|---|---|---|---|---|
| 2014/0059357 A1* | 2/2014 | Andersson | G06F 21/602 | |
| | | | 713/189 | |
| 2014/0215241 A1* | 7/2014 | Yoon | G06F 1/3275 | |
| | | | 713/320 | |
| 2015/0082428 A1* | 3/2015 | Dokey | H04L 63/1408 | |
| | | | 726/22 | |
| 2015/0233289 A1* | 8/2015 | Younkins | F02D 35/023 | |
| | | | 73/114.79 | |
| 2017/0108552 A1* | 4/2017 | Roumi | G01R 31/386 | |
| 2018/0196490 A1 | 7/2018 | Ail et al. | | |
| 2019/0064892 A1 | 2/2019 | Kim et al. | | |
| 2019/0163250 A1 | 5/2019 | Lee et al. | | |
| 2019/0354681 A1 | 11/2019 | Hauser et al. | | |
| 2020/0117565 A1* | 4/2020 | Ponnuvel | G06F 11/27 | |
| 2021/0294399 A1* | 9/2021 | Belvant More | G05B 13/0265 | |
| 2023/0011278 A1* | 1/2023 | Fox | G06F 11/3692 | |
| 2023/0213915 A1* | 7/2023 | Cheng | G06F 1/206 | |
| | | | 700/300 | |

* cited by examiner

Identify an expected parameter
value range

106

Compare a received analog
parameter value of the hardware
component to the identified
expected parameter value range

108

Determine whether the analog
parameter value is within or
outside the expected parameter
value range.

110

104

100

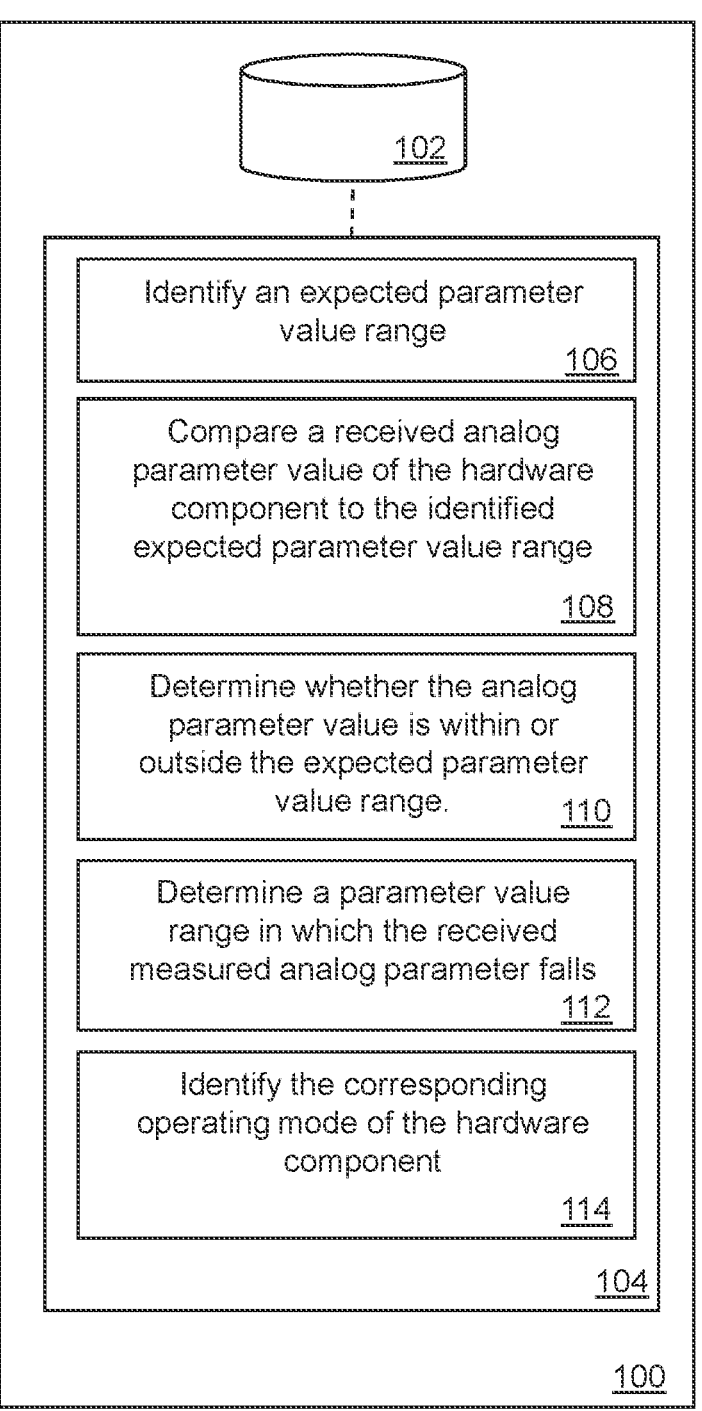

Identify an expected parameter
value range

106

Compare a received analog
parameter value of the hardware
component to the identified
expected parameter value range

108

Determine whether the analog
parameter value is within or
outside the expected parameter
value range.    110

Determine a parameter value
range in which the received
measured analog parameter falls

112

Identify the corresponding
operating mode of the hardware
component

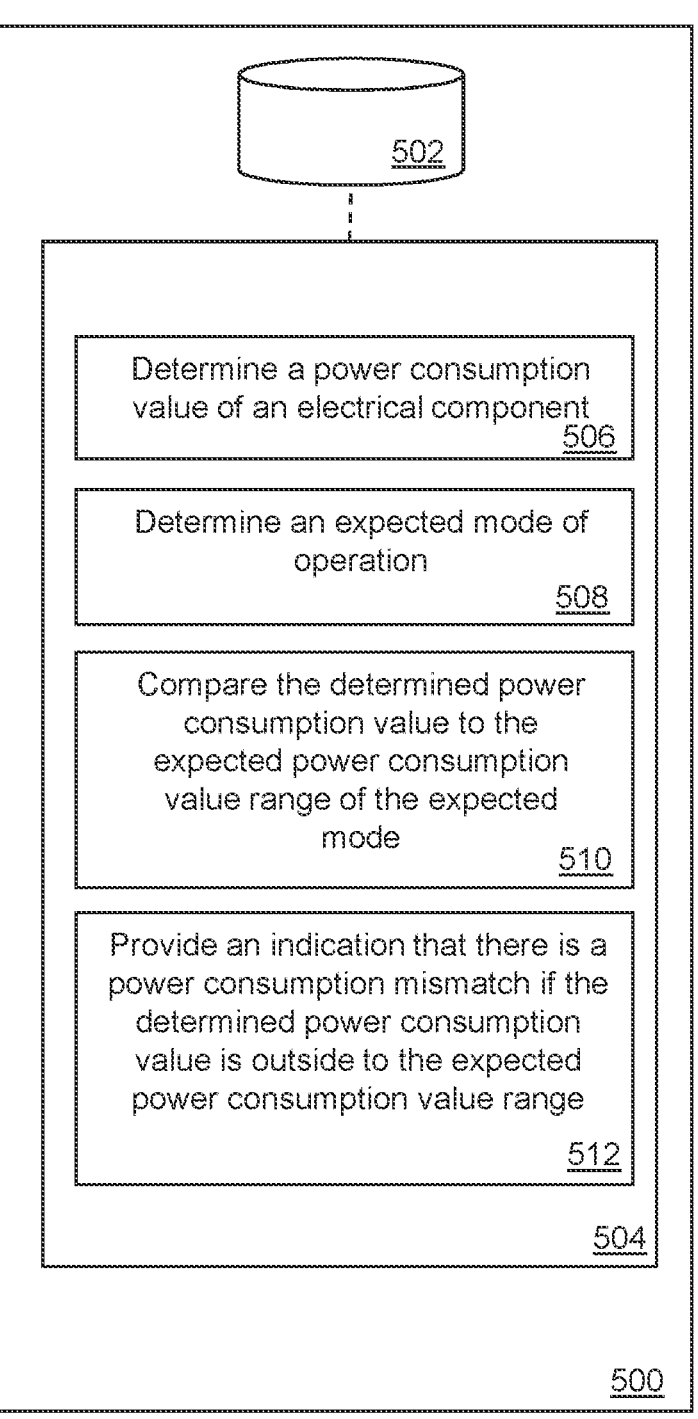

Determine a power consumption
value of an electrical component
506

Determine an expected mode of
operation
508

Compare the determined power
consumption value to the
expected power consumption
value range of the expected
mode
510

Provide an indication that there is a
power consumption mismatch if the
determined power consumption
value is outside to the expected
power consumption value range
512

Determine if a measured power consumption of a component operating in an operation mode of the component is within an expected range of values of power consumption of the operating mode

702

OUTSIDE

Output an error indicator          704

ANALOG PARAMETER MONITOR

BACKGROUND

An electronic device may comprise one or more components which are powered to operate. Different types of operation of a component, such as operating in different modes, may operate at different levels of power. Assessing the power mode of a hardware component may allow other properties to be determined for the component.

BRIEF INTRODUCTION OF THE DRAWINGS

Various features of the present disclosure will be apparent from the detailed description which follows, taken in conjunction with the accompanying drawings, which together illustrate features of the present disclosure, and wherein:

FIG. 2 shows a schematic representation of a device to determine whether an analog parameter of a component is as expected and determine a current operating mode of the component based on the analog parameter value, according to an example of the disclosure;

FIG. 5 shows a schematic representation of a computing device to provide an indication of power mismatch for a component operating in a mode, according to an example of the disclosure;

Figure 6:
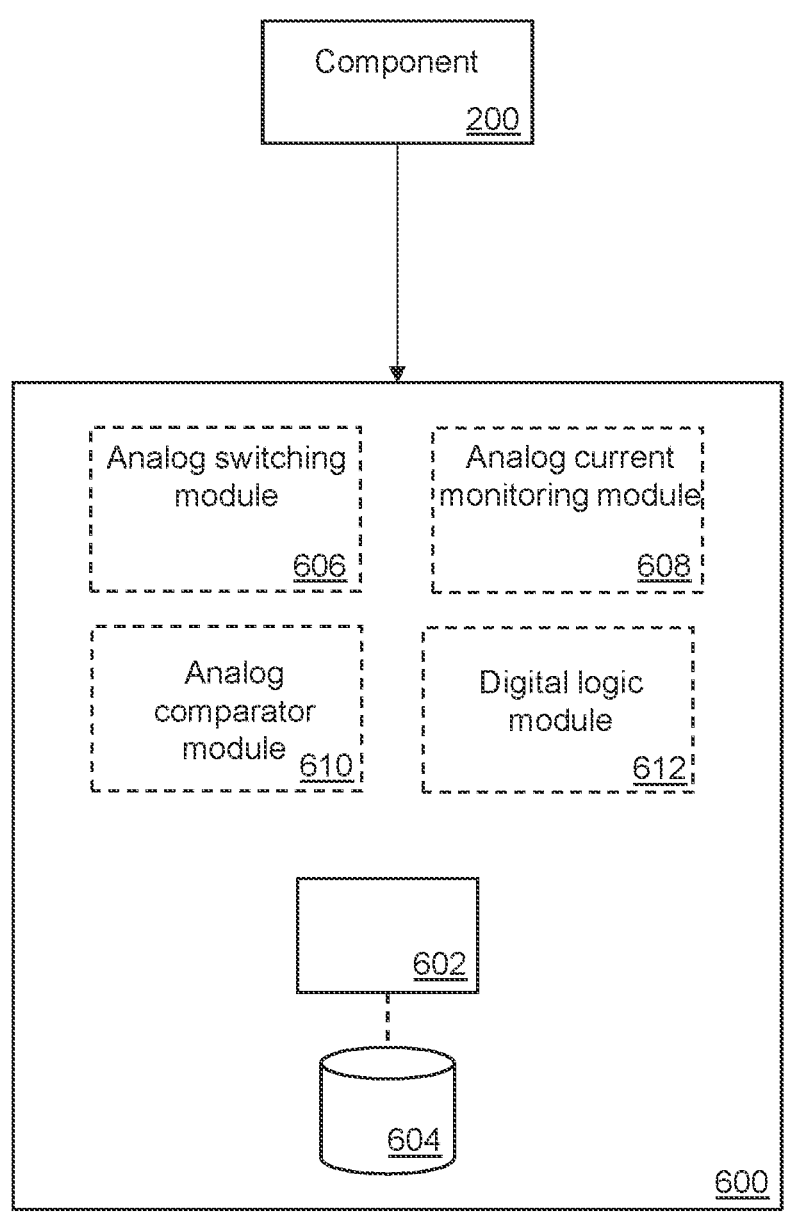
Figure 7:
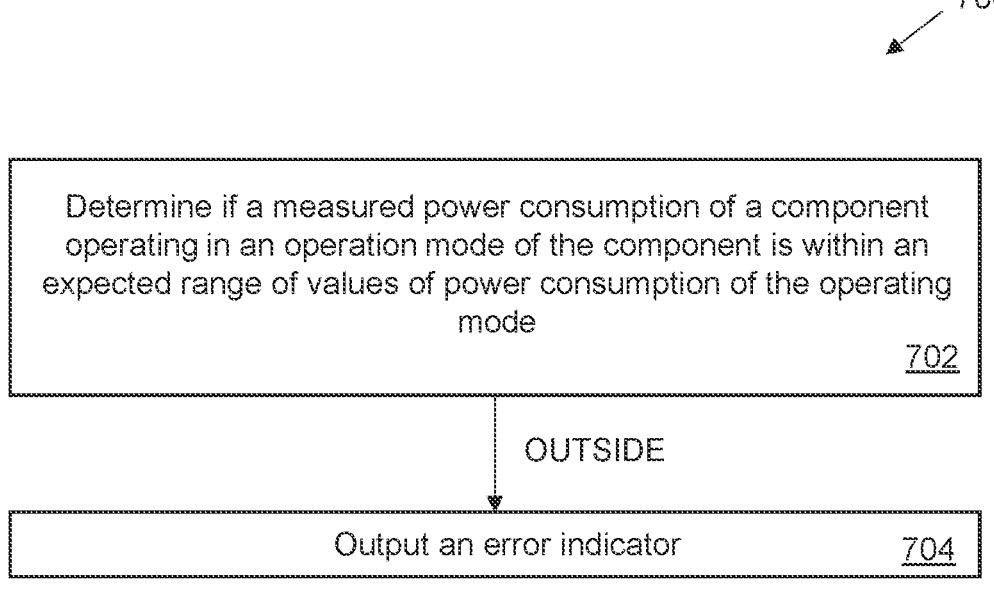

FIG. 6 shows a schematic representation of a computing device including analog electronic components to monitor power consumption of a component, according to an example of the disclosure; and FIG. 7 illustrates an example workflow which indicates an error if a measure power consumption of a component is not as expected for the operating mode of the component, according to examples of the disclosure.

DETAILED DESCRIPTION

In the following description, for purposes of explanation, numerous specific details of certain examples are set forth. Reference in the specification to "an example" or similar language means that a particular feature, structure, or characteristic described in connection with the example is included in at least that one example, but not necessarily in other examples.

Assessing the power mode of a hardware component with confidence may help in deducing other properties of the component. An example of a property which may be deduced from the power mode of an operating component is a restriction which is set on the component, such as a security restriction. When a variation of power states is associated with the variation of another property of interest (e.g. security setting), monitoring an analog parameter of the component, such as the power state (through the observation of the power consumption in this example) may allow for indirectly monitoring of any variation of the other property (e.g. the security setting).

Such indirect monitoring of a component property may allow improved/enhanced privacy of a user (for example, by allowing a deduction as to whether or not a camera of an electronic device is switched on or off). Another example is allowing for a determination of a limited bandwidth of camera picture. A further example is the monitoring of component security; for example, is an untrusted microcontroller (i.e. a microcontroller provided by a third party) running while a sensitive workload is running on a trusted microcontroller, which may enable an attack from the untrusted to the trusted controller domain. Another security-related example is determining whether or not a processor running in a particular power mode enables and/or disables one or more processor capabilities, thus changing the level of security which the processor is operating at. Of course, there are other examples encompassed by the idea of monitoring an analog component property to indirectly determine a related property of the component.

To enable such an insight, a determination may be made regarding which power state a component is operating in. Power consumption of a component is correlated to the power states of the component. In an extreme case, knowing the power consumption of a component allows a determination to be made whether the component is enabled or disabled (i.e., some non-zero power is consumed versus no or very low (below a minimum threshold power) power is consumed). In some cases, for example relating to security or privacy, the component(s) used to perform the monitoring should be trusted, and thus should be well isolated/protected from possible malicious attacks.

Examples disclosed herein encompass an example in which an isolated trusted secure domain in a platform is configured to monitor power consumed by one or more other components in the platform (or another analog property/parameter of the component, such as current or temperature), and this monitoring allows assessment of the discrete power mode the component is in (e.g. low, medium, or high power mode, or Advanced Configuration and Power Interface, ACPI, power modes). The component's mode/state derived from this monitoring can be compared to the expected mode/state. Based on the result of this comparison, another property of interest can possibly be assessed for example. In the event of a mismatch between expected and detected state, this may trigger a further action. Some action may be taken by the trusted domain if there is a mismatch with a programmed policy (that is, if the determined power mode does not agree with the expected power mode), e.g., providing an error indicator notifying the user, constraining the platform, taking recovery steps to force a trusted environment, stopping component operation, and/or verifying the initial determination of a mismatch, for example. Other responses are also possible.

Figure 1:
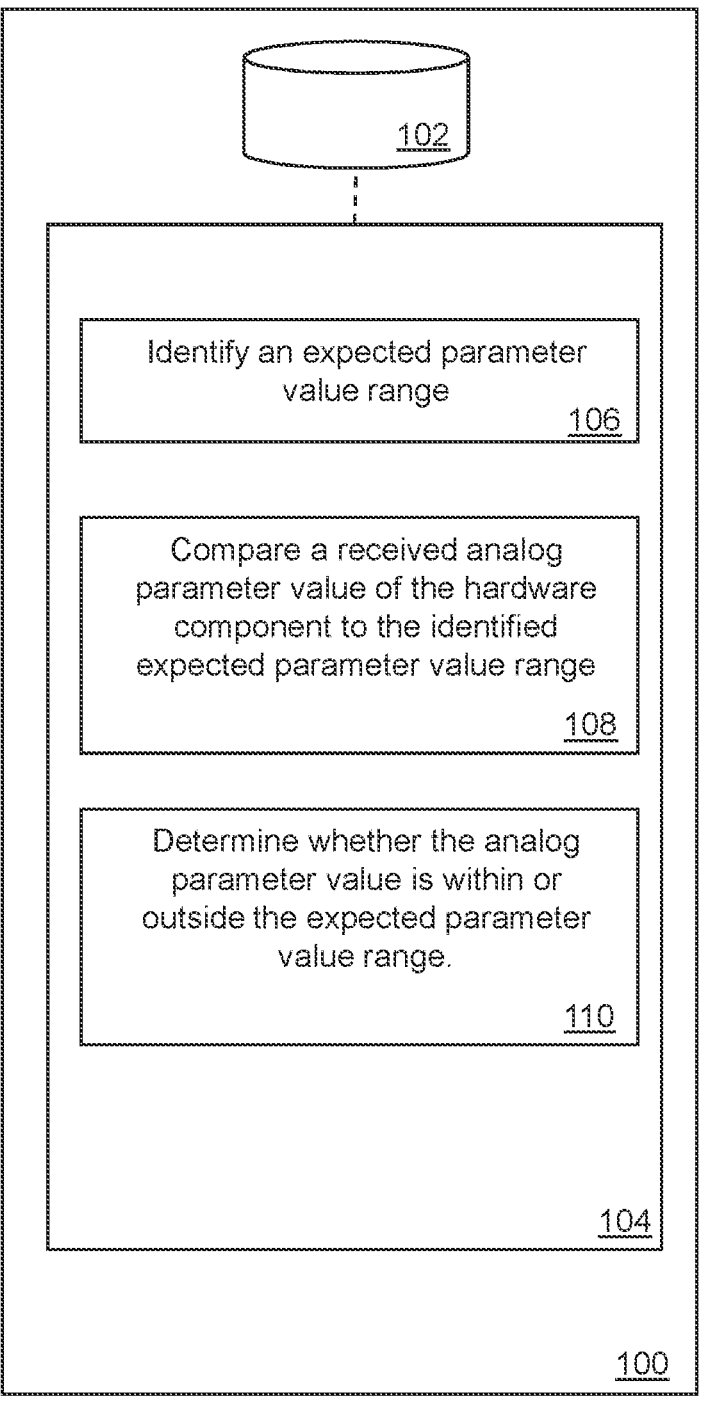
FIG. 1 shows a schematic representation of a device to determine whether an analog parameter of a component is as expected, according to an example of the disclosure.

FIG. 1 shows a schematic representation of a device to determine whether an analog parameter of a component (which may be termed a hardware component, computer component, or computer system component) is as expected. The computing device 100 comprises a memory 102 storing software, and a processor 104. The device 100 may be, for example, a suitably programmed chip in a device, may be a module of a device, or may be the device. The component of which an analog parameter is analysed may be part of the device 100 or may be separate from and in communication with the device 100.

The device 100 is to identify an expected parameter value range of a plurality of expected parameter value ranges of the hardware component of the computing device, shown as step 106. The device 100 in some examples may identify the expected parameter range by setting the expected parameter range, and/or receiving a signal (e.g. from the component 200 or from a further connected device controlling the parameter range setting of the component 200) indicating the expected parameter range which has been set for the component 200.

The device 100 in some examples may identify the expected parameter range based on the expected mode, and using a look up table or other reference (which may be available at the apparatus 100 or may be available at a storage remote from and in communication with the apparatus 100) indicating operating modes of the component and corresponding parameter ranges. The device 100 in some examples may identify the expected parameter range by setting the operating mode of the component 200, and/or receiving a signal (e.g. from the component 200 setting the operating mode, or from a further connected device controlling the mode setting of the component 200) indicating the expected mode, and using a look up table or similar reference to identify the expected parameter range for the set operating mode. For example, the operation mode of the component 200 may be controlled by a mode selection device, such as an analog or a digital mode selection or switching device. In some examples, the operation mode of the component 200 may be set through a software platform controlling the operation of the component 200. In some examples, the apparatus 100 may control the mode in which the component 200 operates.

Thus, the apparatus 100 may identify the expected parameter range in some examples by the apparatus 100 receiving a signal indicating a mode and determining an expected parameter range from that mode, or receiving a signal indicating the expected parameter range, from another component or device. The apparatus 100 in some examples may identify the expected parameter range in some examples by polling or sending a request message to the component 200 (either directly or via a further component) and receiving a reply signal indicating the mode (and determining an expected parameter range from that mode), or receiving a reply signal indicating the expected parameter range, from another component or device. The apparatus 100 may be considered to identify the expected parameter range by receiving or determining an expected operating mode and identifying, through comparison of the operating mode with a reference, what the corresponding expected parameter range is.

The expected parameter value range may be one of a plurality of non-zero value ranges in some examples. In some examples, the expected parameter value range may be a zero value (within a range of tolerance values about zero) or a non-zero value range. A parameter may be, for example, a single/instantaneous value, an average value of a plurality of single values, a set of a plurality of values, a value indicating a signal obtained over a finite time period, or other measure of the value, according to different implementations.

The expected parameter value range corresponds to a set operating mode of the hardware component. For example, the component may operate in a low power mode, mid power mode, and high power mode, wherein each mode is associated with a finite and at least partially distinct range of power consumption values (as an analog parameter of the component). As another example, there may be two power modes: on and off. There is energy consumed in the on mode, but no energy consumed in the off mode. This may be of interest to check if an untrusted component is disabled during a security sensitive operation. It may also be of interest to guarantee or verify that a security component is enabled during a security operation. It may also be of interest to guarantee or verify that two components are mutually in different on/off states to prevent one from attacking the other. Other examples are possible.

In other examples, a hardware component may be able to operate in several power modes. These may be modes that are related to the platform system power mode (for example, ACPI power modes) or may be more granular modes for a given ACPI-like mode (for example, dynamic voltage and frequency scaling, DVFS). Whatever the mechanism implementing the power modes, a goal is to limit energy consumption to a level that enables the expected functionality within safe bounds (e.g., temperature). One way to reduce energy is to disable one or more sub-components (e.g., number of active cores), or by tuning frequency and/or voltage, for example. The capabilities associated to the given component may then be limited accordingly.

The device 100 is to compare an analog parameter value of the hardware component to the identified expected parameter value range, shown as step 108. The analog parameter value may be received by the device 100 from the component. For example, the device 100 may poll (e.g. periodically) the component to request transmission, or to retrieve, the parameter value. The device 100 may be considered to observe the parameter value of the component in some examples, for example by monitoring the component behaviour. The parameter value may be obtained periodically in some examples. The parameter value may be monitored by the device 100 and obtained (for comparison as described herein) in response to an event, such as a parameter value being different to a previous parameter value by a percentage of the value (e.g. 5% of the value), a parameter value being different to a previous parameter value by an absolute amount (e.g. 5° C. if the analog parameter is temperature, 1 mW if the analog parameter is power consumption), or in the event of the parameter value changing to be within a parameter range associated with a different operating mode to a previous or an expected operating mode. The parameter value may be obtained from the component directly to the device 100 in some examples, or in some examples may be provided to the device 100 via one or more analog (and in some examples, digital) components (e.g. monitoring component(s)).

There is a notion of trust in the information (i.e. the parameter value, at least) gathered by the monitoring device 100. In an example in which the observed component is transmitting the parameter value, it is desirable to have a secure system by which the transmitted information is trusted to be accurate (and not, for example, spoofed/falsified by a malicious code running on the component). Thus, in some examples, an assessment may be made that the trusted boundaries/relationship between the device 100 and the component are not defined by the components which perform the information gathering and transmission, but rather, for example, a part of the monitored component is trusted to gather that information on behalf of the monitoring device 100 and transmit that information to the device 100. This trusted subpart of the observed component may be considered to be a part of the monitoring device, from a security point of view.

The device 100 is then to determine whether the analog parameter value is within or outside the expected parameter value range, shown as step 110.

In this way, the device 100 is able to detect whether a hardware component is in an expected power mode or state, or whether the component is not operating in an expected mode. The analog parameter may be, for example, power consumption, current flow, temperature of the component, voltage, frequency, electromagnetic (EM) property, acoustic property (e.g. which may be generated by a discrete analog component such as a capacitor, which may be on a power supply path to an integrated circuit (IC)), a photonic property, or other analog characteristic which may be qualitatively associated with an energy consumption. For example, as energy consumption increases, so too may the current, power, and temperature. Thus such a device may allow for an assessment of whether a platform (by way of the operation of the hardware component) is running in the expected (e.g. security) settings.

The analog parameter may not necessarily be an absolute value, but may be a delay measurement, average value over a finite timeframe, a derivative, or a differential of the absolute measurement. For example, a delay or derivative of a temperature reading may be used as an analog parameter. The analog parameter may be associated with another analog value in some examples, wherein one analog parameter varies according to a predefined relationship or equation with another analog parameter, such as temperature related to current, or voltage related to frequency, for example. In such examples, the plural related analog parameters may be taken into consideration, wherein one analog parameter may be used as a confirmation or check of the validity of another related analog parameter (for example, to reduce false positive readings or help omit spikes in readings of an analog parameter from consideration).

If the component is expected to be running in a particular mode, and an analog parameter of the component is determined to be outside the range of analog parameters for the expected mode, this may indicate the component is not running the expected mode. For example, if a processor is operating to run malicious code then it may operate at a higher energy consumption than if the processor was, as expected/desired, running without the malicious code operating, wherein the higher energy consumption causes the component to draw more power to the extent that the operating power is associated with a higher power operating mode than that expected if there is no higher power draw due to the malicious code running. As another example, an increase load due to unauthorised operation of the component may lead the power policy management system to raise the power mode.

In another example, it may be the determined operating mode which is compared to the expected operating mode, rather than the determined analog parameter being determined to be within or outside a range of values of the analog parameter of an expected operating mode. For example, a device such as device 100 may identify an analog parameter value of the hardware component, identify an operating mode of the hardware component by identifying that the analog parameter value is within a range of analog parameter values associated with the operating mode (of a plurality of possible operating modes each having an associated range of analog operating values), and determine whether the operating mode of the component is the same, or different, to an expected operating mode of the component.

Rather than this method of mode determination of a component being a preventative method, this device and method of operation of the device may be considered to be detection-based, i.e. able to detect that the computing device is not in an expected state and/or confirm that the computing device is in an expected operation state. Rather than being a digital monitoring system, which observes the digital behaviour or content of the monitored system (or constitutive components) (e.g. by observing some digital content characteristic of the monitored system, possibly on a main communication channel between the monitored and the monitoring systems), examples disclosed herein may be considered to consider a side-effect, or secondary effect, which arises as a consequence of the (digital) system behaviour and which influences an analog property or parameter of the component. Among such side-effects (which may be thought of as happening on a so-called side-channel), the behaviour of analog characteristics such as power consumption and temperature, for example, may be used to determine information about the discrete state (e.g. the operating mode of a plurality of possible modes) of a computing system.

It may be difficult to trick the device 100 into making a determination that the component is in a mode other than the actual operating mode, because the analog parameter (e.g. power consumption, current drawn, component temperature) which is used to determine whether the component is in the expected mode or not is a secondary indicator of operation which is not easily spoofed or falsified. Examples disclosed herein therefore provide a way to monitor a characteristic of hardware which is difficult to hide or tamper with.

The term "mode" may be understood in some examples to relate to the power mode of a hardware component; that is, a set of discrete power states a component can be within. The energy consumed (as a value in a range of values associated with each power mode) by the component may be different in each power state. It may be that, the more power-consuming a power state is, the more performance is provided by the component (e.g., the component operates at a higher frequency or uses more cores) or additional hardware capabilities are used. Power modes may be used to cap the performance of the component when there is a power budget constraint (e.g., a low power mode may be executed when the device has a low battery (e.g. <10% battery power remaining) or for heat reasons (e.g. temperature to remain below 50° C.), for example.

The term "mode" may be understood in some examples to relate to the modes of privilege (or, in other words, the mode of execution). Such privilege modes may be considered as states of a component that provide different functional properties (e.g., security levels). For example, the privilege modes may relate to the execution privilege levels implemented by various processors. In some privilege modes, some hardware capabilities may not be allowed to run.

In some examples, execution/privilege modes and power modes may be related. For example, a change in the power mode may also cause a change in the privilege mode (e.g. higher privileges, such as read, write and execute-allowed privileges are related to a higher power mode, and/or reduced privileges such as read-only and no write/no execute, are related to a lower power mode). As another example, when transitioning between a privileged execution mode that an OS kernel operates in (e.g., L1 on ARM processors) and the unprivileged mode in which applications operate (e.g., L0 for ARM), there may be energy variations specific to the privilege mode, but there may not necessarily be a change which is significant (e.g. large) enough to cause a change in the power mode. As another example, there may be a limited subset of potential execution modes in a given power mode. Examples disclosed herein may also apply to examples in which relationships between power modes and other mode types, such as privilege modes, are present, and wherein one mode of a particular type may encompass a plurality of modes of a different type (e.g. three privilege levels fall within one power mode).

The above discussion relates to power modes and privilege modes (e.g. relating to security and privacy operation of the component). However, it will be appreciated that, provided there is a known relationship between available modes of different/other types, the examples disclosed herein may still be applicable. For example, a computer architect may investigate differences in capability (i.e. differences in behaviour) of a component in various operation modes, and identify if any difference in the analog parameter values in different operation modes could be of interest to monitor that analog parameter as a property of interest. For the sake of simplicity, the properties focused on in the document relate to monitoring security and privacy, but this does not limit the scope of applicability of examples discussed herein to these examples or properties.

In general, the state of a component may be monitored by monitoring component activity (e.g. monitoring the component power state by monitoring power consumption, monitoring the component activity/computation load by monitoring surface temperature of the component, or monitoring any other analog parameter as an indication of component activity). The monitoring system, comprising the device 100 described above, may be implemented in various ways. For example, the device 100 may be or may comprise a distinct component on the motherboard, may comprise an IP block with power monitoring capabilities (an IP block may be considered to be a subpart of an IC, which implements a subset of functions), and/or may comprise a discrete platforms to measure the analog parameter using a specific port, etc.

FIG. 2 shows a schematic representation of a device to determine whether an analog parameter of a component is as expected and determine a current operating mode of the component based on the analog parameter value, according to an example of the disclosure. As in FIG. 1, the device 100 comprises a memory 102 storing software, and a processor 104. Further to the features described in relation to FIG. 1, in this example, if the analog parameter value is determined to be outside the expected parameter value range as determined in step 110 as illustrated, the processor 104 is to determine a parameter value range in which the analog parameter falls, as shown in step 112. For example, if a power range of 10 mW to 20 mW is expected for a component which is expected to be operating in a mid-power mode, and a power value of 22 mW is compared to this expected range, then the value is determined to be outside the range. In some examples the value may be determined to be either within or outside the expected range. In some examples, the value, if determined to be outside the expected range, may be determined to be above or below the expected range. In this example, 22 mW is determined to be higher than the upper bound of the expected range. The processor in this example is to determine that the parameter value is in a possible parameter range of (for example) 20 mW to 28 mW.

The processor 104 is to identify the corresponding operating mode of the hardware component associated with the determined parameter value range as the present operating mode of the hardware device, as shown in step 114. In this example, the identified mode may be a high power mode of the component which is a mode of operating within which the power consumption of the component is expected to be between 20 mW and 28 mW. In this way, the device may be able to identify an operating mode of the component which is different to the expected operating mode. The device may, as discussed above, take this determination of an actual operating mode and perform a further step or steps, such as reporting the determined mode to a user, or taking steps to try and cause the component to operate in the expected mode (e.g. mid-power mode) and not the actual operating mode (high power mode).

In some examples, the determined operating mode may be a mode in which the operating parameter is lower than the lower bound of a parameter value range of the expected operating mode. For example, if the operating power is 15 mW, this is below the lower bound of 20 mW of the example mid-power mode. In some examples, the operating parameter may be above an upper bound of a highest parameter range (e.g. if there is a fault causing overheating), or may be below a lower bound of a lowest parameter range (e.g. if there is a fault or reason for the component not to operate at all and report a low, or zero (or near zero) parameter value). In other examples the operating parameter may represent a set of a plurality of operating parameter values, for example a series of readings captured over a period of time, or an average value of a plurality of values.

Figure 3:
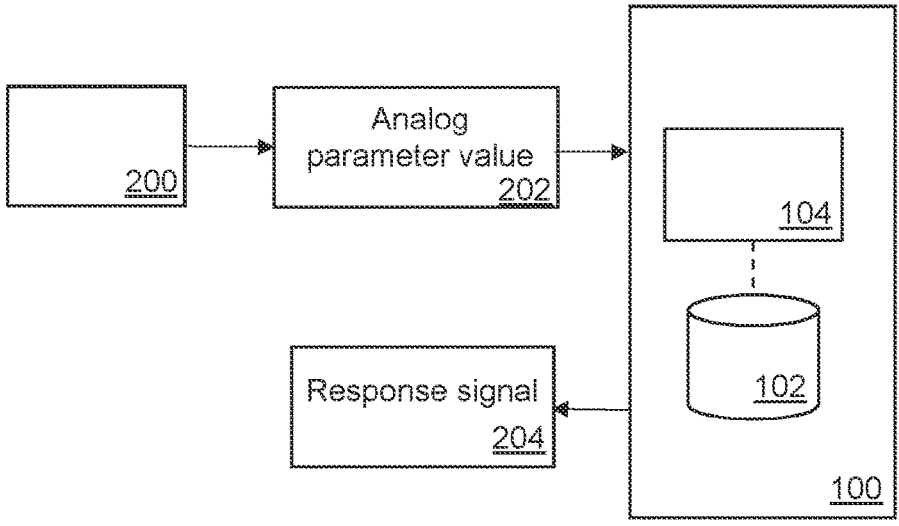
FIG. 3 shows a schematic representation of a device to provide a response signal to a component, according to an example of the disclosure.

FIG. 3 shows a schematic representation of a device 100 comprising a memory 102 and processor 104 as above, wherein the device 100 is to provide a response signal 204, for example to the component 200 and/or to an output device to indicate the results of the comparison. As illustrated, the device 100 may receive an analog parameter value 202 from a component 200. Following determination of whether the analog parameter 202 is within or outside an expected parameter value range corresponding to an expected operating mode of the component 200. The device 100 may then generate, and may provide, a response signal 204. For example, if the analog parameter value 202 is determined to be outside the expected parameter value range, the device 100 may generate a response signal 204 to cause the analog parameter value 202 to change to be within the expected parameter value range (such as, for example, sending a signal to disable a portion of the component activity, force a change in security settings to disable activity, or set a different operating mode (e.g. a new power mode)).

Other examples of such a response signal include: providing a notification indicating the analog parameter value is outside the expected parameter value range (for example, a user alert light displayed on an LED indicator, an error message displayed on a display screen, or an alert sound provided to an audio output device); limiting permitted activity of the component until the parameter value is determined to be within the expected parameter value range (for example, security privileges may be withheld until the operating mode of the component is as expected, and/or additional security checks have been made to ensure that there is no (further) malicious activity carried out in relation to the component); and performing a recovery procedure to change the parameter value to be within the expected parameter value range (for example, the operating domain of the parameter may be ringfenced or isolated until the secure operation of the component has been verified to help prevent malicious activity taking place).

In some examples, the processor 104 of the device 100 is to compare the analog parameter value 202 of the hardware component 200 to the expected parameter value range of the component 200 within a secure trusted software platform which is isolated from the hardware component. In this way, if the component is used for malicious and/or insecure purposes, causing the operating parameters to have values outside an expected "secure" operating range, then the device 100 which performs the check of whether or not the parameter values are within or outside an expected operating range is secured, in the secure trusted platform, from any malicious or insecure activity at the component. In this way, a more trusted determination may be made with isolation safeguards to help prevent any malicious activity affecting the comparison of value to an expected value range by the device 100.

Figure 4:
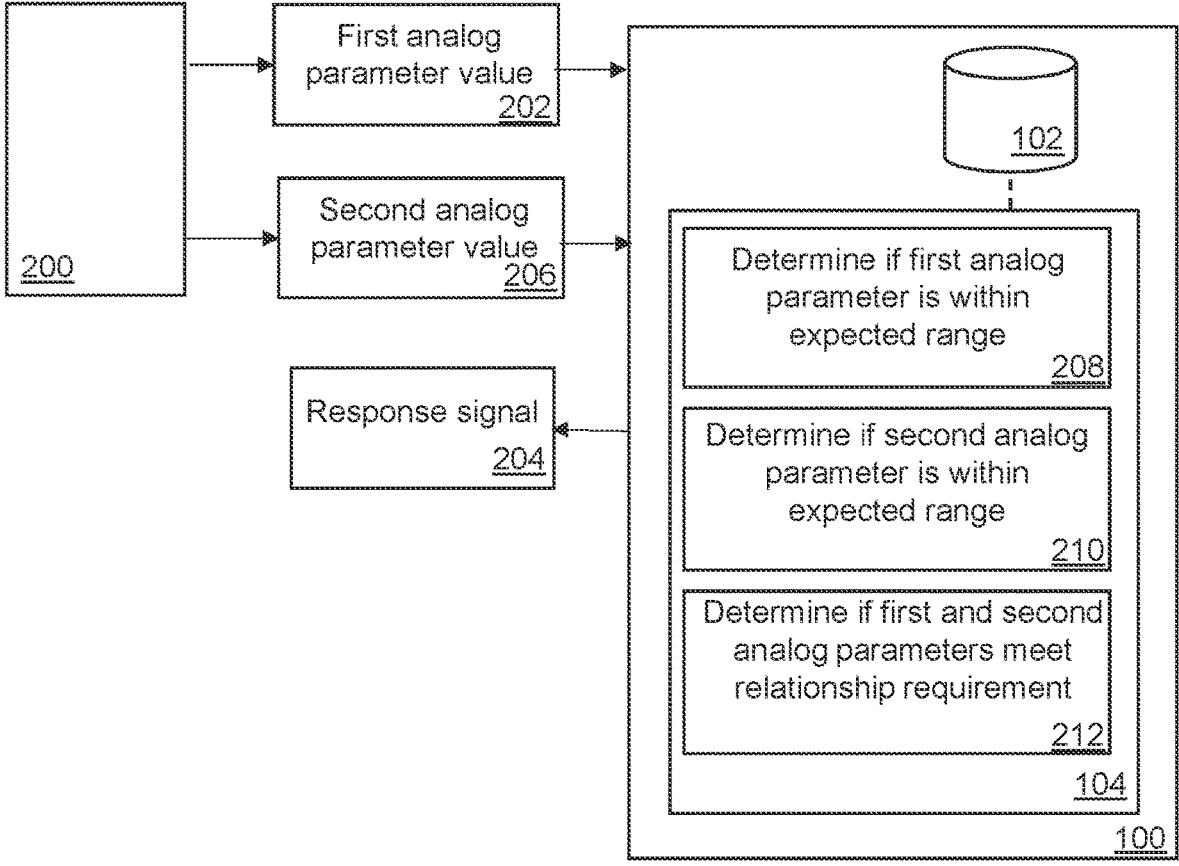
FIG. 4 shows a schematic representation of a device to determine whether a plurality of related analog parameters of a component are as expected, and provide a corresponding response signal, according to an example of the disclosure.

FIG. 4 shows a schematic representation of a device 100 to determine whether a plurality of related analog parameters 202, 206 of a component 200 are as expected. In this example, the device 100 is to provide a response signal 204 in relation to determining whether first and second analog parameter values are within respective expected value ranges, for example as discussed in relation to FIG. 3. The device 100 is to compare a first analog parameter value 202 of the hardware component 200 to a first identified expected parameter value range 208, and compare a second analog parameter value 206 of the hardware component 200 to a second expected parameter value range of a second plurality of expected parameter value ranges of the hardware component 200. Each of the first plurality of expected parameter value ranges is associated with a corresponding operating mode of the hardware component, and each of the second plurality of expected parameter value ranges is associated with the corresponding operating mode of the hardware component. There is a relationship between the first expected parameter value range and the second expected parameter value range. For example one functionality should be disabled while another functionality of the component is enabled. The device 100 in this example is to determine whether the first analog parameter value 202 is within or outside the first expected parameter value range 208 and whether the second analog parameter value is within or outside the second expected parameter value range 210. The device 100 is also to determine whether the first analog parameter value 202 and the second analog parameter value 206 meet the relationship (for example, is one low as the other is high). In another example, the relationship between the first and second analog parameters may be present in the form of a function, wherein the operating mode is a function of the first and second analog parameters.

In another example, which may be considered a variation of the arrangement of FIG. 4, a device 100 may determine whether a plurality of related analog parameters 202, 206 of two separate components are as expected. In this example, the device 100 is to provide a corresponding response signal 204, for example as discussed in relation to FIG. 3. The device 100 is to compare a first analog parameter value 202 of the first hardware component to a first identified expected parameter value range 208, and compare a second analog parameter value 206 of a second, different, hardware component of the computing device to a second expected parameter value range of a second plurality of expected parameter value ranges of the second hardware component. Again, each of the first plurality of expected parameter value ranges is associated with a corresponding operating mode of the first hardware component, and each of the second plurality of expected parameter value ranges is associated with a corresponding operating mode of the second hardware component. Also, there is a relationship between the first expected parameter value range and the second expected parameter value range of the respective first and second components. The device 100 is to determine whether the first analog parameter value is within or outside the first expected parameter value range, and determine whether the second analog parameter value is within or outside the second expected parameter value range; and determine whether the first analog parameter value and the second analog parameter value meet the relationship (for example, is the first component is operating in high power mode, the second component should not be operating in a high power mode).

FIG. 5 shows a schematic representation of a computing device 500 to provide an indication of power mismatch 512 for a component operating in a mode. The computing device 500 comprises a memory 502 storing software, and a processor 504. The processor 504 is to determine a mode of operation, of a plurality of available modes of operation, of an electrical component, based on a power consumption value of the electrical component being within a power consumption value range of the mode of operation, as shown in step 506. That is, based on a power consumption value obtained from the component, a mode of operation is determined, based on that power consumption value being within a range of power consumption values associated with that mode.

The device 100 is then to determine an expected mode of operation of the plurality of available modes of operation, wherein the expected mode of operation is associated with an expected power consumption value range, as shown in step 508. For example, the component may be controlled to perform in a low power mode and this is the intentional mode which the component should be operating in.

The device 500 in some examples may determine the expected mode of operation by itself setting the operating mode of the component. The device 500 in some examples may determine the expected mode of operation by receiving a signal from the component indicating the mode of operation is has been set to operate in (the signal may be sent without request from the device 500 in some examples, and the signal may be sent in response to a request for mode indication from the device 500 in some examples). The device 500 in some examples may determine the expected mode of operation by receiving a signal from a further component in communication with the component 200 and the device 500 (the signal may be sent without request from the device 500 in some examples, and the signal may be sent in response to a request for mode indication from the device 500 in some examples). Such a further component may cause the component 200 to operate in a particular mode (and may be e.g. a digital or analog mode switching element such as element 606 or 612 in FIG. 6).

The device 500 is then to compare the determined mode of operation to the expected mode of operation, as shown in step 510. If the determined mode of operation is not the expected mode of operation, the device 100 is to provide an indication that there is a mode mismatch of the electrical component, as shown in step 512. For example, if the component is a camera, and the user is running a computing device comprising the camera in a privacy mode in which the camera should be deactivated, the expected power mode of the camera would be a low (or zero) power mode. If, on determining the power consumption of the camera component, it is determined to fall within a "high power" power consumption range (for example, through malware causing the camera to operate and spy on the user), this would be determined to be a mismatch which is indicated (for example by an alarm, visual, audio and/or haptic alert, a shut-down command to cease or pause operation of the camera and/or computing device, and/or other indication of the mismatch).

This example compares a current/present operating mode to an expected operating mode. In other examples, as discussed in relation to FIG. 1, the power consumption value may be compared with a range of expected power consumption values for an expected mode (that is, the value is compared with values for an expected mode, rather than the current mode being determined and compared with an expected mode). Examples in which a mode is determined and compared with an expected mode may allow for the current mode to be determined/classified, for example alongside a probability and/or confidence value of the determined mode being correct, and then a comparison of the determined and expected modes may be made. In this way, the device 100 allows for some flexibility in determination of the mode through different ways of determining the value, for example, as an instantaneous value, a time-averaged value, a statistically-analyzed value, or other measure of the parameter value.

By identifying an operating mode, and comparing this to an expected mode, for example an expected mode associated with a policy (e.g., an acceptable succession of power modes, timing in each power mode, a given set of power modes which should not be activated in a particular context, etc.) there are different possible way of using the comparison to determine whether a component is operating according to the expected policy. For example, an instantaneous power mode may be compared to a set of expected power modes at the point in time of obtaining the instantaneous power mode. As another example, the set of expected power modes may evolve based on the current state of operation of the component and the expected power mode, and movement into the next state. These two examples are instantaneous-value comparisons. A further example is that the device 100 is to record a succession of power modes, and compare the flow of power modes at a later time; this may be used to perform error correction in mode determination if there is an error in the characterization of a particular power mode.

In some examples, the plurality of modes (for example, corresponding to a plurality of power value consumption values) may be non-overlapping (for example, 5 mW to 10 mW, 10 mW to 20 mW and 20 mW to 40 mW). In some examples, the plurality of modes may be at least partially overlapping (for example, 5 mW to 10 mW, 8 mW to 15 mW, 15 mW to 20 mW and 18 mW to 25 mW). Overlaps in mode parameter values may be present if there are variations in the parameter values of two modes, where some values may overlap. For example, if the parameter is a statistical value or a signal, there may be an overlap present between values of adjacent modes.

In some examples, there may be a first comparison between a determined mode (determined from an obtained parameter value) and an expected mode, and a confirmation of determination, to be performed by comparing the parameter value to a value range of the expected mode. A comparison of a value to a range of expected values may be used in examples where an instantaneous value is used in the comparison, rather than a comparison over a longer period of time after recording a full signal.

In the above discussion of operational modes of the component, the plurality of available modes of operation may respectively correspond to a plurality of discrete power modes of the electrical component, wherein each discrete power mode is associated with a corresponding level of electrical component functionality. For example, a component may be expected to operate in a low power mode, or a high power mode. The plurality of available modes of operation may respectively correspond to a plurality of privilege modes of the electrical component, wherein each privilege mode is associated with a corresponding level of functionality of the electrical component. For example, the privilege modes may be "restricted", "partially restricted" (which may be associated with a higher power consumption that the "restricted" mode) and "free" (which may be associated with the highest power consumption of the component.

FIG. 6 shows a schematic representation of a computing device 600 (which may be the device 100 or 500 discussed above) including analog electronic components 606, 608, 610 to monitor power consumption of a component. Determining the operational mode and/or the analog parameter values of the component may use analog instrumentation, which in turn may use an analog interface between the component and the output. In some examples, the instrumentation may be analog, for example using one or more analog switches to set the expected modes, a resistor to monitor the current consumed by the monitored component, and analog based comparator(s) to determine if the determined analog parameter value is within or outside the expected range. In such an example, the monitored value characteristics of the possible power modes may be set at design time through appropriate selection of an analog resistor, for example. Such an analog instrumentation implementation may be made without requiring complex or expensive electronics. Thus, analog instrumentation implementations may be cheap to provide, and may use a few discrete analog components such as resistors (e.g. to sense the current by monitoring the voltage at the poles of the resistor) and op-amps to implement comparators.

In some examples, there may be one or more digital logic elements 612, e.g., to allow for varying set of policies to be implemented and changed; to use more tunable detection and recovery algorithms; and/or to allow for a generic design that can be tuned to a given platform/component, for example. The use of analog and digital electronics would be used in such examples, and may therefore use analog-to-digital converters (ADCs) and possibly digital-to-analog converters (DACs), for example, to allow for modification of the analog properties of the analog instrumentation circuits, such as thresholds. In some examples, at least a portion of the analog and/or digital elements may be part of the device 100; for example, a register used to define the power modes of a component may be included in the device, and may therefore be accessible within the trusted boundaries/trusted platform within which the device 100 is to operate. In some examples, at least a portion of the analog and/or digital elements may be part of the component 200 being monitored. In some examples, at least a portion of the analog and/or digital elements may be distinct from and able to be in electrical connection with the device 100 and/or the component 200.

Examples disclosed herein also include implementations having digital components, which may be considered to be complementary to analog-only implementations, and may be able to provide an additional level of security at a low cost. Further, using both analog and digital elements in implementing the devices disclosed here may reduce the overall vulnerability of the device, as analog components may be robust against attacks against digital component, and digital components may be robust against different types of attacks against analog components, which may make a successful attack more challenging to achieve. Improved (e.g. more reliable and trusted) components may be made according to examples of this disclosure. For example, components that are constrained (for example disabled) to match a product's specifications may be monitored, and enabling them may be more difficult for a user/owner who wishes to bypass the restrictions.

FIG. 6 illustrates example elements 606, 608, 610, 612, one or more of which may be present as part of the device

600. In some examples, the computing device 600 may comprise an analog property monitoring module 608 (e.g. an analog current monitoring module, for example comprising a resistor) connected to the electrical component 200, wherein the analog property monitoring module 608 is to receive an analog property (e.g. electrical current) characteristic of the electrical component 200 and provide an indication of the property characteristic for use in the determination of the mode of operation of the electrical component based on the determined power consumption value. In some examples, the computing device 600 may comprise an analog comparator module 610 connected to the analog current monitoring module 608, the analog comparator module 610 to compare the determined mode of operation of the electrical component 200 to the expected mode of operation, and provide an indication of whether or not the mode of operation and expected mode of operation match.

The computing device 600 may comprise an analog switching module 606 to set an operating mode of the electrical component 200, wherein the expected power consumption value range is dependent on the set operating mode. In examples comprising such an analog switching module 606, the device 600 may be able to configure a trusted register in the observed component. The computing device 600 may comprise a digital logic mode module 612 to set the expected mode of operation of the electrical component 200. Dependent on the elements present, the comparison of modes and/or parameter values with expected modes and/or parameter values may be performed in an analog manner or a digital manner. In examples comprising both analog and digital electronics, the computing device 600 may comprise one or more of an analog-to-digital converters (ADCs) to provide a communication path from an analog to a digital component, and a digital-to-analog converters (DACs) to provide a communication path from a digital to an analog component.

FIG. 7 illustrates an example workflow 700 which indicates an error if a measured power consumption of a component is not as expected for the operating mode of the component. This workflow may be implemented as computer-readable instructions, for example, in the form of a non-transitory computer-readable medium comprising instructions that, when executed, cause a processor of a computing device (for example, a processor 104, 504 of device 100, 500) to operate as described herein. In other examples, workflows disclosed herein may be performed by a suitably programmed chip, and computer-readable instructions may be software, firmware, microcode, or other programming that defines or controls functionality or operations as disclosed herein. That is, the computer-readable instructions 700 may, when executed on a processor, cause the processor to determine if a measured power consumption of a component operating in an operation mode of the component is within an expected range of values of power consumption of the operating mode 702; and if the measured power consumption is determined to be outside the expected range of values, output an error indicator 704.

The expected range of values of power consumption of the operating mode may be either zero or non-zero. The expected range of values of power consumption of the operating mode may be a discrete non-zero finite range of values of a plurality of discrete non-zero finite ranges of values. The computer-readable instructions, when executed, may run within a secure trusted computing environment isolated from the hardware component 200, and may be to receive the measurement of power consumption of the component via a secure trusted connection.

Overall, examples disclosed herein may be considered to relate to inferring a hardware component's properties, based on knowledge of a mode of the component (for example, assessed via observation of the component power consumption). Certain examples may be considered to relate to how these properties impact on policy configuration for the component (for example, determining if the component is operating in the expected mode i.e. according to an expected policy). Some examples may relate to security considerations of a device component; for example, if a component is not operating in an expected power consumption range, this may be an indication that malicious activity is taking place causing the component to run at a higher-than-expected power.

Examples disclosed herein may allow for component activity to be monitored, and used to determine if there is a security breach of that component, without the security breach itself being able to provide a false result to the monitoring causing it to appear as if there is no unexpected operation of the attacked component. This may occur, for example, if a malicious attack program is able to both use the component to obtain unauthorised access to secure code, as well as cause the attack to be hidden or disguised from any security monitoring software. That is, examples discussed herein may provide a solution to improving the security of computer systems and execution environments which is less vulnerable to known attacks to maliciously use the component.

Examples disclosed herein use monitoring of an analog property (e.g. power consumption) of the system component. In comparison to digital solutions that present a digital interface, which may be exploited using known attacking techniques, the proposed solution may be more resistant to attack because it is more difficult to exploit the properties of an analog and provide a false indication of no malicious activity. Examples disclosed herein monitor a characteristic of hardware which is difficult to hide or tamper with. For example, different power modes are associated with different levels of consumed energy, which are characteristic of the mode. Energy consumption is different between different modes (e.g. between on and off states) which is difficult to falsify.

All of the features disclosed in this specification (including any accompanying claims, abstract, and drawings) may be combined in any combination, except combinations where some of such features are mutually exclusive. Each feature disclosed in this specification, including any accompanying claims, abstract, and drawings), may be replaced by alternative features serving the same, equivalent, or similar purpose, unless expressly stated otherwise. Thus, unless expressly stated otherwise, each feature disclosed is one example of a generic series of equivalent or similar features. The claims should not be construed to cover merely the foregoing examples, but also any variants which fall within the scope of the claims.

The following numbered paragraphs also form a part of this disclosure

1. A computing device, comprising: a memory storing software; and a processor; to: identify an expected parameter value range of a plurality of expected parameter value ranges of a hardware component of the computing device, the expected parameter value range corresponding to a set operating mode of the hardware component; compare an analog parameter value of the hardware component to the identified expected parameter value range; and determine whether the analog parameter value is within or outside the expected parameter value range.

2. The computing device of paragraph 1, wherein the processor is to, if the analog parameter value is determined to be outside the expected parameter value range: determine a parameter value range in which the analog parameter falls, and identify the corresponding operating mode of the hardware component associated with the determined parameter value range as the present operating mode of the hardware device.

3. The computing device of paragraph 1 or 2, wherein the processor is to, if the analog parameter value is determined to be outside the expected parameter value range, generate a response signal to cause the analog parameter value to change to be within the expected parameter value range.

4. The computing device of any of paragraphs 1 to 3, wherein the response signal comprises one or more of: providing a notification indicating the analog parameter value is outside the expected parameter value range; limiting permitted activity of the component until the parameter value is determined to within the expected parameter value range; and performing a recovery procedure to change the parameter value to be within the expected parameter value range.

5. The computing device of any of paragraphs 1 to 4, wherein the processor is to compare the analog parameter value of the hardware component to the expected parameter value range of the component within a secure trusted software platform isolated from the hardware component.

6. The computing device of any of paragraphs 1 to 5, wherein the processor is to: compare a second analog parameter value of a second hardware component of the computing device to a second expected parameter value range of a second plurality of expected parameter value ranges of the second hardware component, wherein each of the second plurality of expected parameter value ranges is associated with a corresponding operating mode of the second hardware component, and wherein there is a relationship between the expected parameter value range and the second expected parameter value range; determine whether the second analog parameter value is within or outside the second expected parameter value range; and determine whether the analog parameter value and the second analog parameter value meet the relationship.

7. A computing device, comprising: a memory storing software; and a processor; to: determine a mode of operation, of a plurality of available modes of operation, of an electrical component, based on a power consumption value of the electrical component being within a power consumption value range of the mode of operation; determine an expected mode of operation of the plurality of available modes of operation, wherein the expected mode of operation is associated with an expected power consumption value range; compare the determined mode of operation to the expected mode of operation; and if the determined mode of operation is not the expected mode of operation, provide an indication that there is a mode mismatch of the electrical component.

8. The computing device of paragraph 7, wherein the plurality of available modes of operation respectively correspond to one or more of: a plurality of discrete power modes of the electrical component, each discrete power mode associated with a corresponding level of electrical component functionality; and a plurality of privilege modes of the electrical component, each privilege mode associated with a corresponding level of functionality of the electrical component.

9. The computing device of paragraph 7 or 8, comprising an analog current monitoring module connected to the electrical component, the analog current monitoring module to receive a current characteristic of the electrical component and provide an indication of the current characteristic for use in the determination of the mode of operation of the electrical component based on the determined power consumption value.

10. The computing device of any of paragraphs 7 to 9, comprising an analog comparator module connected to the analog current monitoring module, the analog comparator module to compare the determined mode of operation of the electrical component to the expected mode of operation, and provide an indication of whether or not the mode of operation and expected mode of operation match.

11. The computing device of any of paragraphs 7 to 10, comprising an analog switching module to set an operating mode of the electrical component, wherein the expected power consumption value range is dependent on the set operating mode.

12. The computing device of any of paragraphs 7 to 11, comprising a digital logic mode module to set the expected mode of operation of the electrical component.

13. A non-transitory computer-readable medium comprising instructions that, when executed, cause a processor of a computing device to: determine if a measured power consumption of a component operating in an operation mode of the component is within an expected range of values of power consumption of the operating mode; and if the measured power consumption is determined to be outside the expected range of values, output an error indicator.

14. The non-transitory computer-readable medium of paragraph 13, wherein one or more of: the expected range of values of power consumption of the operating mode is either zero or non-zero; and the expected range of values of power consumption of the operating mode is a discrete non-zero finite range of values of a plurality of discrete non-zero finite ranges of values.

15. The non-transitory computer-readable medium of paragraph 13 or 14, wherein the instructions, when executed, run within a secure trusted computing environment isolated from the hardware component, and are to receive the measurement of power consumption of the component via a secure trusted connection.

The invention claimed is:

1. A computing device, comprising:
a memory storing software; and
a processor to:
identify an expected parameter value range of a plurality of expected parameter value ranges of a hardware component of the computing device, the expected parameter value range corresponding to a set operating mode of a plurality of available operating modes of the hardware component;
compare an analog parameter value of the hardware component to the identified expected parameter value range;
determine whether the analog parameter value is within or outside the expected parameter value range; and in response to a determination that the analog parameter is outside the expected parameter value range, generate a response signal to cause the analog parameter value to change to be within the expected parameter value range.

2. The computing device of claim 1, wherein the processor is to, in response to a determination that the analog parameter is outside the expected parameter value range:

determine a parameter value range in which the analog parameter falls; and identify the corresponding operating mode of the hardware component associated with the determined parameter value range as the present operating mode of the hardware device.

3. The computing device of claim 1, wherein the processor is to, in response to the determination that the analog parameter value is outside the expected parameter value range, one or more of:

limit permitted activity of the hardware component until the parameter value is determined to within the expected parameter value range; or perform a recovery procedure to change the parameter value to be within the expected parameter value range.

4. The computing device of claim 1, wherein the processor is to compare the analog parameter value of the hardware component to the expected parameter value range of the component within a secure trusted software platform isolated from the hardware component.

5. The computing device of claim 1, wherein the processor is to:

compare a second analog parameter value of a second hardware component of the computing device to a second expected parameter value range of a second plurality of expected parameter value ranges of the second hardware component, wherein each of the second plurality of expected parameter value ranges is associated with a corresponding operating mode of the second hardware component, and wherein there is a relationship between the expected parameter value range and the second expected parameter value range;

determine whether the second analog parameter value is within or outside the second expected parameter value range; and determine whether the analog parameter value and the second analog parameter value meet the relationship.

6. The computing device of claim 1, wherein the analog parameter is at least one of a power consumption of the hardware component, a current flow of the hardware component, a temperature of the hardware component, a voltage of the hardware component, a frequency of the hardware component, and electromagnetic property of the hardware component, an acoustic parameter of the hardware component, or a photonic property of the hardware component.

7. The computing device of claim 1, wherein the plurality of available operating modes are respectively correlated with a corresponding plurality of power consumption values for the hardware component.

8. A computing device, comprising:

a memory storing software; and a processor to:

determine a power consumption value of an electrical component based on an analog parameter value of an electrical component;

determine a mode of operation, of a plurality of available modes of operation, of the electrical component, based on the power consumption value of the electrical component being within a power consumption value range of the mode of operation;

determine an expected mode of operation of the plurality of available modes of operation, wherein the expected mode of operation is associated with an expected power consumption value range;

compare the determined mode of operation to the expected mode of operation; and in response to a determination that the determined mode of operation is not the expected mode of operation:

provide an indication that there is a mode mismatch of the electrical component, and change the mode of operation of the electrical component to be the expected mode of operation.

9. The computing device of claim 8, wherein the plurality of available modes of operation respectively correspond to one or more of:

a plurality of discrete power modes of the electrical component, each discrete power mode associated with a corresponding level of electrical component functionality; or a plurality of privilege modes of the electrical component, each privilege mode associated with a corresponding level of functionality of the electrical component.

10. The computing device of claim 8, comprising an analog current monitoring module connected to the electrical component, the analog current monitoring module to receive a current characteristic of the electrical component and provide an indication of the current characteristic for use in the determination of the mode of operation of the electrical component based on the determined power consumption value.

11. The computing device of claim 10, comprising an analog comparator module connected to the analog current monitoring module, the analog comparator module to compare the determined mode of operation of the electrical component to the expected mode of operation, and provide an indication of whether or not the mode of operation and expected mode of operation match.

12. The computing device of claim 8, comprising an analog switching module to set an operating mode of the electrical component, wherein the expected power consumption value range is dependent on the set operating mode.

13. The computing device of claim 8, comprising a digital logic mode module to set the expected mode of operation of the electrical component.

14. The computing device of claim 8, wherein the processor is to receive the analog parameter value of the hardware component from an analog instrumentation that monitors a characteristic of the electrical component.

15. The computing device of claim 14, further comprising the electrical component.

16. A non-transitory computer-readable medium comprising instructions that, when executed, cause a processor of a computing device to:

determine whether a measured power consumption of a component operating in an operation mode of the component is within an expected range of values of power consumption of the operating mode, wherein the operating mode is one of a plurality of available operating modes; and in response to a determination that the measured power consumption is outside the expected range of values, output an error indicator and one or more of:

limit permitted activity of the component until the measured power consumption is determined to within the expected range of values; or perform a recovery procedure to change the measured power consumption to be within the expected range of values.

17. The non-transitory computer-readable medium of claim 16, wherein one or more of:

the expected range of values of power consumption of the operating mode is either zero or non-zero; and the expected range of values of power consumption of the operating mode is a discrete non-zero finite range of values of a plurality of discrete non-zero finite ranges of values.

18. The non-transitory computer-readable medium of claim 16, wherein the instructions, when executed, run within a secure trusted computing environment isolated from the hardware component, and are to receive the measurement of power consumption of the component via a secure trusted connection.

19. The non-transitory computer-readable medium of claim 16, wherein the instructions, when executed, cause the processor of the computing device to, in response to the determination that the measured power consumption is outside the expected range of values, verify the determination.

20. The non-transitory computer-readable medium of claim 16, the instructions, when executed, cause the processor to determine whether the measured power consumption of the component is within the expected range of values of power consumption based on an analog monitoring signal indicating the power consumption of the component.

\* \* \* \* \*